(12) United States Patent
Cui et al.

(10) Patent No.: US 11,264,450 B2
(45) Date of Patent: Mar. 1, 2022

(54) SEMICONDUCTOR DEVICE AND MANUFACTURING METHOD

(71) Applicant: WeEn Semiconductors Technology Co., Ltd., Jiangxi (CN)

(72) Inventors: Jingjing Cui, Jiangxi (CN); Eddie Huang, Jiangxi (CN); Jianfeng Zhang, Jiangxi (CN)

(73) Assignee: WeEn Semiconductors Technology Co., Ltd., Nanchang (CN)

(*) Notice: Subject to any disclaimer, the term of this patent is extended or adjusted under 35 U.S.C. 154(b) by 223 days.

(21) Appl. No.: 16/613,800

(22) PCT Filed: Aug. 21, 2019

(86) PCT No.: PCT/CN2019/101738
§ 371 (c)(1),
(2) Date: Nov. 15, 2019

(87) PCT Pub. No.: WO2021/003806
PCT Pub. Date: Jan. 14, 2021

(65) Prior Publication Data
US 2021/0335996 A1    Oct. 28, 2021

(30) Foreign Application Priority Data
Jul. 11, 2019 (CN) .......... 201910624457.2

(51) Int. Cl.
*H01L 29/872* (2006.01)
*H01L 29/06* (2006.01)
*H01L 29/66* (2006.01)

(52) U.S. Cl.
CPC ...... *H01L 29/0611* (2013.01); *H01L 29/0657* (2013.01); *H01L 29/66143* (2013.01); *H01L 29/872* (2013.01)

(58) Field of Classification Search
CPC ....... H01L 29/47–475; H01L 29/66143; H01L 29/66212; H01L 29/872–8725
See application file for complete search history.

(56) References Cited

U.S. PATENT DOCUMENTS

| 6,452,244 B1 | 9/2002 | Miura et al. |
| 2005/0194610 A1 | 9/2005 | Souma et al. |
(Continued)

FOREIGN PATENT DOCUMENTS

| CN | 1245587 A | 2/2000 |
| CN | 1943035 A | 4/2007 |
(Continued)

OTHER PUBLICATIONS

The International Search Report for PCT Application No. PCT/CN2019/101738, dated Apr. 13, 2020, 11 pages.
(Continued)

*Primary Examiner* — Daniel P Shook
(74) *Attorney, Agent, or Firm* — Law Offices of Liaoteng Wang

(57) ABSTRACT

The embodiments of the invention provides a semiconductor device and a method for manufacturing it The semiconductor device provided by the embodiments of the invention comprises: a first electrode layer; a substrate layer positioned on the first electrode layer; an epitaxy layer positioned on the substrate layer and comprising a first surface far from the substrate layer; a plurality of well regions disposed by extending from the first surface into the epitaxy layer and orthographic projections thereof on the first surface are spaced from each other; a second electrode layer, comprising first metal layers, each disposed between adjacent two of the well regions on the first surface and forms a Schottky contact with the epitaxy layer, wherein the Schottky contact has variable barrier height. The semiconductor device provided by the embodiments of the invention
(Continued)

may improve the forward conduction ability without affecting the reverse blocking ability.

17 Claims, 3 Drawing Sheets

(56) References Cited

U.S. PATENT DOCUMENTS

| | | | |
|---|---|---|---|
| 2007/0210335 A1 | 9/2007 | Ikeda et al. | |
| 2009/0179297 A1* | 7/2009 | Stewart | H01L 29/872 257/475 |
| 2014/0145289 A1 | 5/2014 | Zhang | |
| 2014/0203299 A1 | 7/2014 | Aketa et al. | |
| 2017/0194450 A1 | 7/2017 | Schulze et al. | |

FOREIGN PATENT DOCUMENTS

| | | |
|---|---|---|
| CN | 108063090 A | 5/2018 |
| JP | H08116072 A | 5/1996 |
| JP | H10117002 A | 5/1998 |
| JP | H11274521 A | 10/1999 |
| JP | 2000252478 A | 9/2000 |
| JP | 2005243715 A | 9/2005 |
| JP | 2006186134 A | 7/2006 |
| JP | 2007324218 A | 12/2007 |
| JP | 2013030618 A | 2/2013 |
| JP | 2014053393 A | 3/2014 |
| JP | 2019102552 A | 6/2019 |
| KR | 1020040028520 A | 4/2004 |
| KR | 1020150078759 A | 7/2015 |

OTHER PUBLICATIONS

The First Office Action for Korean Application No. 10-2019-7036448, dated Mar. 26, 2021, 18 pages.
The First Office Action for Singaporean Application No. 11201910866X, dated Apr. 1, 2021, 8 pages.
The Extended European Search Report for European Application No. 19783408.8, dated Feb. 18, 2021, 9 pages.
The First Office Action for Japanese Application No. 2019-564780, dated Dec. 21, 2021, 12 pages.

* cited by examiner

SEMICONDUCTOR DEVICE AND MANUFACTURING METHOD

CROSS REFERENCE

The present application is a National Stage of International Application No. PCT/CN2019/101738, filed on Aug. 21, 2019, which claims the benefit of priority to Chinese Patent Application No. 201910624457.2, filed on Jul. 11, 2019, both of which are hereby incorporated by reference in their entireties.

TECHNICAL FIELD

The present disclosure relates to the field of semiconductor technology. More particularly, this disclosure relates a semiconductor device and a method for manufacturing it.

BACKGROUND

Schottky diode is an ultra-high-speed semiconductor device, which has a long history of development and mature technology. It is widely used in the field of energy conversion and mostly used in high-frequency application environment. Increasing the forward conduction capacity of Schottky diodes per unit area indicates better forward conduction capacity, so that the loss of conduction energy is reduced and the energy efficiency of product is improved. However, the traditional improvement of forward conduction capability of Schottky diodes per unit area often leads to the increase of reverse blocking leakage current.

Therefore, a new improved semiconductor device is needed.

SUMMARY

The embodiment of the present invention provides a semiconductor device and its manufacturing method, which can improve the forward conduction ability without affecting the reverse blocking ability.

On the first aspect, the embodiments of the present invention provide a semiconductor device, comprising: a first electrode layer; a substrate layer positioned on the first electrode layer, the substrate layer is a first conductive type and has a first doping concentration; an epitaxy layer positioned on the substrate layer and comprising a first surface far from the substrate layer, the epitaxy layer is the first conductive type and has a second doping concentration; a plurality of well regions of a second conductive type, the well regions are disposed by extending from the first surface into the epitaxy layer and orthographic projections thereof on the first surface are spaced from each other; a second electrode layer, comprising first metal layers, each disposed between adjacent two of the well regions on the first surface and forms a Schottky contact with the epitaxy layer, wherein the Schottky contact has variable barrier height.

According to one aspect of an embodiment of the present invention, the Schottky contact of the first metal layer has a lower barrier height at the areas close to the well region than other area.

According to one aspect of an embodiment of the present invention, the epitaxy layer are provided with trenches corresponding to at least some of the well regions, and each of the well regions is disposed by extending from side walls and bottom of the trench into the epitaxy layer.

According to one aspect of an embodiment of the present invention, the opening width of each of the trenches is larger than its bottom width.

According to one aspect of an embodiment of the present invention, the second electrode layer further comprises second metal layers, each of which is overlying the side walls and bottom of the trench.

According to one aspect of an embodiment of the present invention, the epitaxy layer is provided with blind holes corresponding to at least some of the well regions, and each of the well regions is disposed by extending from side walls and bottom of the blind hole into the epitaxy layer.

According to one aspect of an embodiment of the present invention, the second electrode layer further comprises third metal layers, each of which is overlying the side walls and bottom of the blind hole.

According to one aspect of an embodiment of the present invention, the depth of the trench is greater than or equal to the depth of the blind hole.

According to one aspect of an embodiment of the present invention, one or more blind holes are disposed between adjacent two of the trenches.

According to one aspect of an embodiment of the present invention, the opening width of the trench is larger than the opening width of the blind hole.

According to one aspect of an embodiment of the present invention, the second electrode layer further comprises an electrical connection layer, and the first metal layer, the second metal layer and the third metal layer are electrically connected via the electrical connection layer.

According to one aspect of an embodiment of the present invention, an ohmic contact is formed between the first electrode layer and the substrate layer, and an ohmic contact is formed between the second metal layer and the corresponding well region and between the third metal layer and the corresponding well region.

According to one aspect of an embodiment of the present invention, the first doping concentration is higher than the second doping concentration, and the first conductive type is opposite to the second conductive type, and the first conductive type is N-type.

In the second aspect, the embodiments of the present invention provide a method for manufacturing semiconductor device, comprising: providing a first electrode layer; providing a substrate layer positioned on the first electrode layer, the substrate layer is a first conductive type and has a first doping concentration; providing an epitaxy layer positioned on the substrate layer and comprising a first surface far from the substrate layer, the epitaxy layer is the first conductive type and has a second doping concentration; providing a plurality of well regions of a second conductive type, the well regions are disposed by extending from the first surface into the epitaxy layer and orthographic projections thereof on the first surface are spaced from each other; providing a second electrode layer, comprising first metal layers, each disposed between adjacent two of the well regions on the first surface and forms a Schottky contact with the epitaxy layer, wherein the Schottky contact has variable barrier height.

According to one aspect of an embodiment of the present invention, the first metal layer with different Schottky contact barrier heights is formed by alloying different metal materials with different Schottky contact barrier heights.

According to one aspect of an embodiment of the present invention, the first metal layer with different Schottky contact barrier heights is formed by alloying metal materials through two times of metal-plating, wherein different annealing temperatures are applied after each metal-plating.

According to one aspect of an embodiment of the present invention, the semiconductor device manufacturing method further comprises: disposing a trench or blind hole on the first surface of the epitaxy layer, disposing a well region around the side walls and bottom of the trench or blind hole by ion implantation, the injection angle of the ion implantation at the side walls of the trench or blind hole is greater than or equal to 7 degrees.

According to an embodiment of the present invention, a Schottky contact is formed between the epitaxy layer and the first metal layer in the second electrode layer with different barrier heights. A portion of the Schottky contact with higher barrier heights leads to higher electric field intensity withstood by the semiconductor device, and a further portion of the Schottky contact with lower barrier heights reduce the threshold voltage of the semiconductor device during forward conduction, so that the ability of forward conduction is improved without affecting the ability of reverse blocking.

In some alternative implementations, the trench and/or blind hole is disposed on the epitaxy layer, and the well region is disposed around the side walls and bottom of the trench and/or blind hole, so that the depth of the well region is deeper and the Schottky contact region is better protected.

In some alternative implementations, the trench is deeper than the blind hole or has a wider opening than the blind hold, and the well region corresponding to the trench is opened earlier when the semiconductor device is forward conducting surge current, improving the ability of the semiconductor device to conduct surge current. Further, an avalanche point will occur at the corner of the trench when the well region corresponding to the trench is in reverse breakdown, improving the avalanche energy withstood by semiconductor devices.

In some alternative implementations, the opening width of the trench is larger than the bottom width of the trench, reducing the dead area of the current line, so that the overall conduction current ability is improved.

In some alternative implementations, the first conductive type is N-type, i.e. the epitaxy layer and the substrate layer are N-type semiconductors. A large number of electrons exist in N-type semiconductors, and electrons have higher mobility, thus having stronger current conductivity.

BRIEF DESCRIPTION OF THE DRAWINGS

Hereinafter, the characteristics, advantages and technical effects of the exemplary embodiment of the present application will be described by referring to the accompanying drawings.

Figure 1:
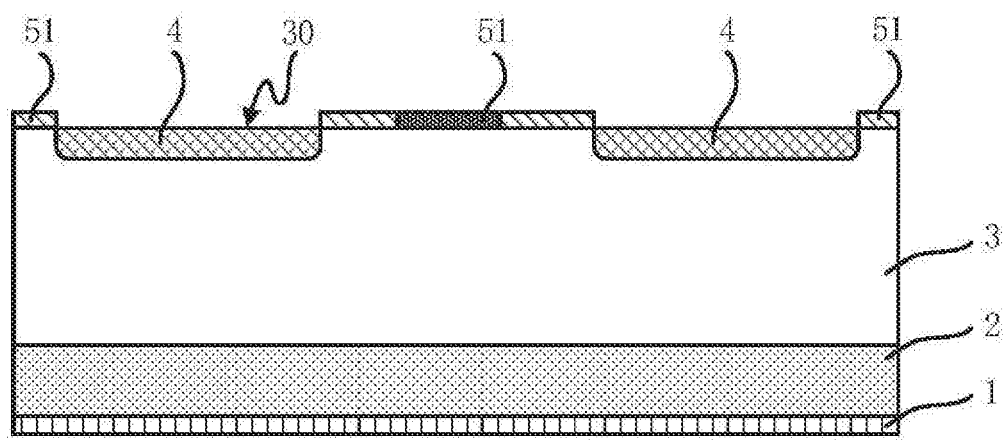
FIG. 1 shows a cross-sectional structure diagram of a semiconductor device according to an embodiment of the present invention.

In the drawings, they are not drawn to scale.
Reference Description:
1—first electrode layer;
2—substrate layer;
3—epitaxy layer; 30—first surface; 31—trench; 32—blind hole;
4—well region;
5—second electrode layer; 51—first metal layer; 52—second metal layer; 53—third metal layer.

DETAILED DESCRIPTION

The following is a further detailed description of the implementation of this application described in conjunction with the drawings and examples. The detailed description and drawings of the following embodiments are used to illustrate the principles of the present application, but cannot be used to limit the scope of the application, that is, the application is not limited to the described embodiments.

It should be noted that in this article, related terms such as first and second are used only to distinguish one entity or operation from another entity or operation, without necessarily requiring or implying any such actual relationship or order between these entities or operations. Moreover, the term "include", "comprise" or any other variation thereof is intended to cover non-exclusive inclusions, so that a process, method, item or device that includes a series of elements includes not only those elements, but also other elements that are not explicitly listed, or elements inherent in such process, method, item or device. In the absence of further restrictions, the elements limited by the statement "including" do not exclude the existence of other identical elements in the process, method, item or device that includes said elements.

It should be understood that as describing the structure of a component, when one layer or area is referred to as "above" or "on" another layer or area, it may refer to directly situating on another layer or area or comprising other layers or areas between it and another layer or area. Moreover, if the component is reversed, the layer or area is "below" or "under" another layer.

FIG. 1 shows a cross-sectional structure diagram of a semiconductor device according to an embodiment of the present invention. In this embodiment, FIG. 1 shows a cross-sectional structure diagram of an active working area of a semiconductor device according to an embodiment of the present invention. Referring to FIG. 1, the semiconductor device according to an embodiment of the present invention includes a first electrode layer 1, a substrate layer 2, an epitaxy layer 3, a well region 4 and a second electrode layer 5. The semiconductor device according to an embodiment of the present invention may be a semiconductor device such as silicon carbide, silicon, etc. Preferably, the semiconductor device according to an embodiment of the present invention is a silicon carbide semiconductor device.

The first electrode layer 1 serves as a cathode of the semiconductor device. The first electrode layer 1 may be a metal layer, which may be gold, silver, copper, or a combination thereof.

Substrate layer 2 is located on the first electrode layer 1. In one embodiment, an ohmic contact is formed between the first electrode layer 1 and the substrate layer 2. The substrate layer 2 is a first conductive type and has a first doping concentration.

Epitaxy layer 3 is located on the substrate layer 2 and comprises a first surface 30 far from the substrate layer 2, the epitaxy layer 3 is the first conductive type and has a second doping concentration. In some alternative implementations, the first conductive type is N-type, and both the substrate layer 2 and the epitaxy layer 3 are N-type semiconductors. There are a large number of electrons in N-type semiconductors. Electrons have higher mobility and thus have stronger current conductivity. In some alternative implementations, the first doping concentration is higher than the second doping concentration, for example the substrate layer 2 is a heavily doped N-type semiconductor and the epitaxy layer 3 is a lightly doped N-type semiconductor.

The well region 4 is extended from the first surface 30 of the epitaxy layer 3 into the epitaxy layer 3. In one embodiment, the well region 4 is formed within the epitaxy layer 3 and at least part of the region overlaps with the first surface 30 of the epitaxy layer 3. The epitaxy layer 3 may have multiple well regions 4. The orthographic projections of multiple well regions 4 on the first surface 30 are spaced from each other. The orthographic projection of the well region 4 on the first surface 30 may be circular, oblong, polygon or strip. The well region 4 is the second conductive type. In some alternative implementations, the first conduction type is opposite to the second conduction type, i.e., the well region 4 is P-type.

The second electrode layer 5 includes a first metal layer 51 disposed between adjacent well regions 4 on the first surface 30. The second electrode layer 5 serves as an anode of the semiconductor device. The first metal layer 51 may be a metal layer of gold, silver, copper or a combination thereof. The first metal layer 51 is located in the area on the first surface 30 of the epitaxy layer 3 which is not corresponding to the well region 4. In one embodiment, the first metal layer 51 is disposed in all the areas on the first surface 30 of the epitaxy layer 3 which is not corresponding to the well region 4. It should be understood that, the first metal layer 51 may be also disposed in part of the area on the first surface 30 of the epitaxy layer 3 which is not corresponding to the well region 4. A Schottky contact is formed between the first metal layer 51 and the epitaxy layer 3 with different barrier heights. That is, the Schottky contact formed between the first metal layer 51 and the epitaxy layer 3 has more than two barrier heights. The Schottky contact regions with the same barrier height in the Schottky contact which has different barrier heights can be continuous or discontinuous. In one embodiment, there are two barrier heights: one is relatively high in Schottky contact of the first metal layer 51, and the other is relatively low. In some alternative implementations, the Schottky contact barrier height of the first metal layer 51 closed to the well region 4 is lower than that of the other areas. That is, the Schottky contact barrier height of the first metal layer 51 between the adjacent well regions 4 on the first surface 30 is higher than that of the Schottky contact barrier height on both sides of the central area. It should be understood that, the central area does not refer to a completely median position, but may include a certain range of offsets on both sides of the median position. In one embodiment, the first metal layer 51 is continuous. In another embodiment, the first metal layer 51 is spaced apart and the spaced first metal layer 51 is electrically connected. In one embodiment, a metal layer is disposed in the area on the first surface 30 of the epitaxy layer 3 which is corresponding to the well region 4. The metal layer contacts with the well region 4 and preferably forms ohmic contact. The metal layer can be electrically connected with the first metal layer 51.

According to an embodiment of the present invention, a Schottky contact with different barrier heights is formed between the first metal layer 51 in the second electrode layer 5 and the epitaxy layer 3. The part with higher Schottky contact barrier heights can make the semiconductor device withstand higher electric field intensity, and the part with lower Schottky contact barrier heights can reduce the threshold voltage of the semiconductor device during forward conduction, thereby enhance the forward conduction capability, improve the energy efficiency of semiconductor devices, but do not affect the reverse blocking ability.

Figure 2:
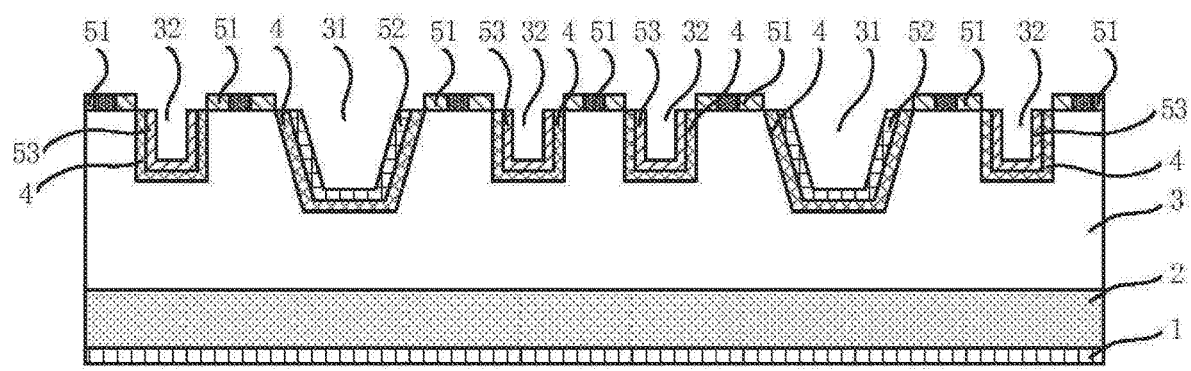
FIG. 2 shows a cross-sectional structure diagram of a semiconductor device according to another embodiment of the present invention.

FIG. 2 shows a cross-sectional structure diagram of a semiconductor device according to another embodiment of the present invention. In some alternative implementations, referring to FIG. 2, at least part of the well region 4 of the epitaxy layer 3 is disposed with a trench 31, and the well region 4 with the trench 31 is disposed within the epitaxy layer 3 around the side walls and bottom of the trench 31. The trench 31 may be disposed on the first surface 30 of the epitaxy layer 3 and formed by recessing from the first surface 30 into the epitaxy layer 3. The trench 31 may be oblong, long strip, etc. The trench 31 may also be round, polygon, etc. The location of the trench 31 corresponds to the well region 4. The well region 4 corresponding to the trench 31 separates the trench 31 from other areas in the epitaxy layer 3. In some alternative implementations, the opening width of the trench 31 is larger than the bottom width of the trench 31. The side walls of the trench 31 may be inclined, and the trench 31 generally forms an inverted trapezoid.

The well region 4 results in a depletion region in reverse blocking, the depletion region will extend into the epitaxy layer 3, and the depletion region of the adjacent well region 4 will gradually approach to form a shielding protection for the intermediate Schottky contact region. The deeper the depth of the well region 4, the better the effect of the shielding protection. A trench 31 is disposed on the epitaxy layer 3, and a trench 4 is disposed within the epitaxy layer 3 around the side wall and bottom of the trench 31, so that the depth of the well region is deeper and the Schottky contact region can be better protected.

Furthermore, the opening width of the trench 31 is larger than the bottom width of the trench 31, which can reduce the dead area of the current line located below the bottom of the trench 31, thereby improving the overall conduction capacity.

In some alternative implementations, the second electrode layer 5 also includes the second metal layer 52, which covers the side wall and bottom of the trench 31. An ohmic contact is formed between the second metal layer 52 and the corresponding well region 4. The second metal layer 52 may be electrically connected with the first metal layer 51. The second metal layer 52 may be a metal layer of gold, silver, copper or a combination thereof.

In some alternative implementations, at least part of the well region 4 of the epitaxy layer 3 is correspondingly provided with a blind hole 32, and the corresponding well region 4 with the blind hole 32 is disposed within the epitaxy layer 3 around the side walls and bottom of the blind hole 32. The blind hole 32 may be disposed on the first surface 30 of the epitaxy layer 3 and formed by recessing from the first surface 30 into the epitaxy layer 3. The blind hole 32 may be circular, polygon, etc. The blind hole 32 may also be oblong, rectangular, etc. The position of the blind hole 32 corresponds to the well region 4. The well region 4 corresponding to the blind hole 32 separates the blind hole 32 from other areas in epitaxy layer 3. The blind hole 32 is disposed on the epitaxy layer 3 and the well region 4 is disposed within the epitaxy layer 3 around the side wall and bottom of blind hole 32, which makes the depth of the well region 4 deeper and can better protect the Schottky contact region. The opening width of blind hole 32 can be equal to the bottom width of blind hole 32. The side wall of the blind hole 32 can be extended vertically, i.e. vertically relative to the first surface 30.

In some alternative implementations, the second electrode layer 5 also includes the third metal layer 53, which covers the side wall and bottom of the blind hole 32. An ohmic contact is formed between the third metal layer 53 and the corresponding well region 4. The third metal layer 53 can be electrically connected with the first metal layer 51. The third metal layer 53 may be a metal layer of gold, silver, copper or a combination thereof.

In some alternative implementations, the depth of the trench 31 is greater than or equal to the depth of the blind hole 32. Preferably, the depth of the trench 31 is greater than that of the blind hole 32. The opening width of trench 31 is larger than that of blind hole 32. The trench 31 is deeper than the blind hole 32 or has a wider opening than the blind hole 32, and the well region corresponding to the trench 31 is opened earlier when the semiconductor device is forward conducting surge current, improving the ability of the semiconductor device to conduct surge current. Furthermore, the depth of the trench 31 is deeper, and the avalanche point will occur at the corner of trench 31 rather than at the edge of semiconductor devices when the well region 4 corresponding to trench 31 is in reverse blocking. Therefore, the avalanche current has a low resistance discharge path, which can improve the avalanche energy endured by semiconductor devices.

In some alternative implementations, one or more blind holes 32 are disposed between the adjacent trenches 31. A plurality of blind holes 32 between the adjacent trenches 31 are spaced apart. In one embodiment, a plurality of trenches 31 are parallelly distributed, and there are multiple blind holes 32 between two adjacent trenches 31.

In some alternative implementations, the second electrode layer 5 also includes an electrical connection layer, the first metal layer 51, the second metal layer 52 and the third metal layer 53 are electrically connected through the electrical connection layer. The electrical connection layer may be a metal layer which is simultaneously laid on the first metal layer 51, the second metal layer 52 and the third metal layer 53. The first metal layer 51, the second metal layer 52 and the third metal layer 53 form electrical short connection through the electrical connection layer. The electrical connection layer may be a thick metal layer. The electrical connection layer may be a metal layer of gold, silver, copper, etc. or a combination thereof.

It should be understood that terminal structures such as field limiting rings or junction terminal extensions may also be disposed at the periphery of the active workspace in semiconductor devices according to embodiments of the present invention.

It should be understood that the embodiment shown in FIG. 2 shows only a portion of a semiconductor device according to an embodiment of the present invention. In the embodiment described in FIG. 2, two blind holes 32 with spaced arrangement are illustrated as examples between the adjacent trenches 31. In other alternative embodiments, there may be one, three, four, ten, and 100 equal number of blind holes 32 between the adjacent trenches 31. And the arrangement of multiple blind holes 32 is not limited to the drawings.

Figure 3:
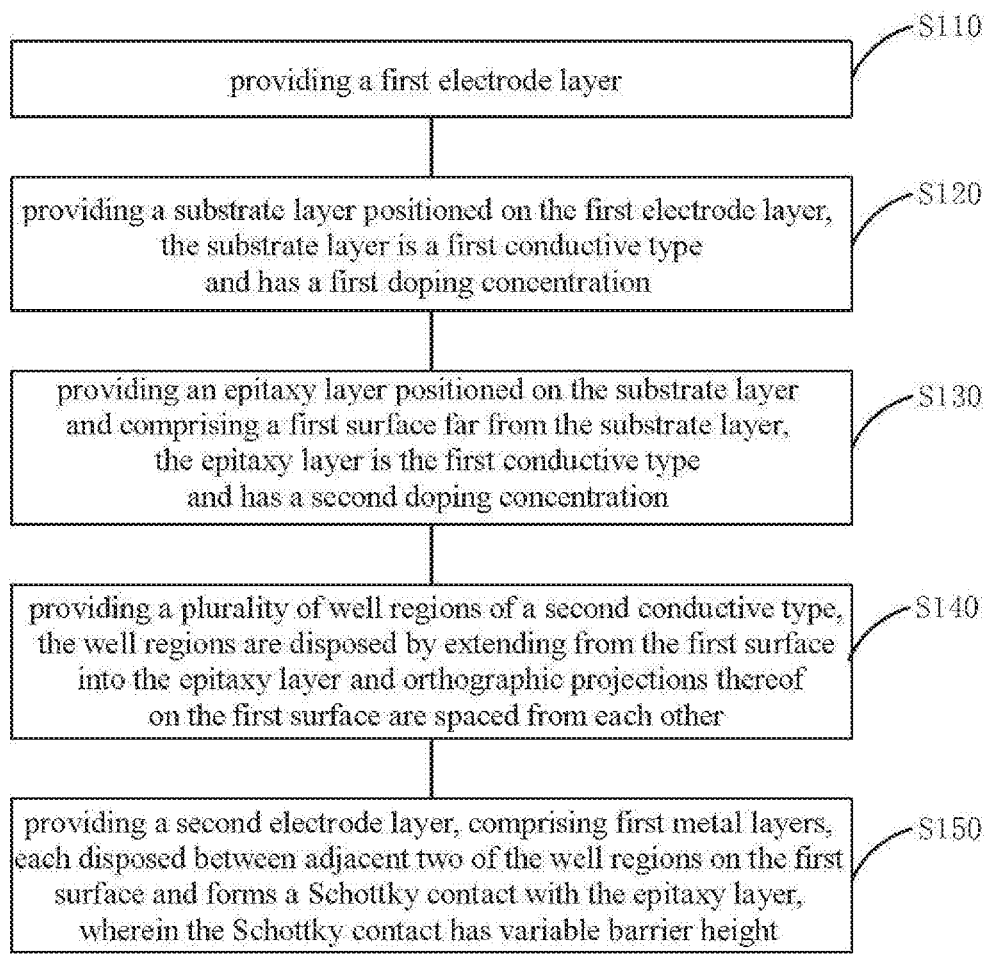
FIG. 3 shows a flow chart of a semiconductor device manufacturing method according to an embodiment of the present invention.

FIG. 3 shows a flow chart of a semiconductor device manufacturing method according to an embodiment of the present invention.

Referring to FIG. 3, a semiconductor device manufacturing method according to an embodiment of the present invention includes following steps:

S110: providing a first electrode layer 1;

S120: providing a substrate layer 2 positioned on the first electrode layer 1, the substrate layer 2 is a first conductive type and has a first doping concentration;

S130: providing an epitaxy layer 3 positioned on the substrate layer 2 and comprising a first surface 30 far from the substrate layer, the epitaxy layer 3 is the first conductive type and has a second doping concentration;

S140: providing a well region 4 of a second conductive type, the well region 4 is disposed by extending from the first surface 30 into the epitaxy layer 3, and orthographic projections of a plurality of well regions 4 on the first surface 30 are spaced from each other;

S150: providing a second electrode layer 5, comprising a first metal layer 51, each disposed between adjacent two of the well regions 4 on the first surface 30 and a Schottky contact is formed between the first metal layer 51 and the epitaxy layer 3 with different barrier heights.

In some alternative implementations, the first metal layer 51 with different Schottky contact barrier heights is formed by alloying different metal materials with different Schottky contact barrier heights.

In some alternative implementations, the first metal layer 51 with different Schottky contact barrier heights is formed by alloying metal materials through two times of metal-plating, wherein different annealing temperatures are applied after each metal-plating.

In some alternative implementations, the semiconductor device manufacturing method further comprises: disposing a trench 31 or blind hole 32 on the first surface 30 of the epitaxy layer 3, disposing a well region 4 around the side walls and bottom of the trench 31 or blind hole 32 by ion implantation, the injection angle of the ion implantation at the side walls of the trench 31 or blind hole 32 is greater than or equal to 7 degrees.

In a specific embodiment, the semiconductor device manufacturing method according to an embodiment of the present invention includes following steps:

providing heavily doped N-type substrate layer 2;

growing lightly doped N-type epitaxy layer 3 on the substrate layer 2;

forming a plurality of trenches 31 recessed into the epitaxy layer 3 at the first surface 30 of the epitaxy layer 3 far from substrate layer 2 by dry etching;

forming a blind hole 32 recessed into the epitaxy layer 3 at the first surface 30 of the epitaxy layer 3 between the epitaxy layer 3 by another dry etching;

Among them, the lateral etching ratio is controlled by changing the proportion of physical anisotropic etching part (such as argon ion bombardment etching) and chemical isotropic etching part (such as fluorine-based gas) in dry etching gas or using side-wall etching suppressing gas (such as Bosh process) to tilt the side wall of trench 31, ensuring that the opening width of the trench 31 is larger than the bottom width of the trench 31, and making the side wall of the blind hole 32 substantially vertical. Moreover, by controlling the etching speed and time of dry etching, the depth of blind hole 32 is not greater than that of trench 31.

The semiconductor device fabrication method according to the embodiment of the present invention also includes the following steps: forming P-shaped well region 4 through high temperature ion implantation process in the lateral wall and bottom epitaxy layer 3 surrounding the trench 31 and blind hole 32, and implanting angle is greater than 7 degrees when ion implantation is performed on the side wall; annealing at high temperature after completion of ion implantation operation to activate implanted ions.

By disposing the trench 31 and blind hole 32 and forming well region 4 around the side wall and bottom of the trench 31 and blind hole 32, the width of corresponding area of Schottky contact can be increased appropriately, which is helpful to reduce the difficulty of subsequent process, especially the lithography of Schottky area.

The semiconductor device manufacturing method according to an embodiment of the present invention also includes steps:

Forming the first metal layer 51 on the area of the first surface 30 of the epitaxy layer 3 which is not corresponding to the trench 31 and blind hole 32, and the first metal layer 51 is contacted with the epitaxy layer 3 to form Schottky contact. The specific steps include: forming a metal layer in the central area between the blind hole 32 and the trench 31 of the first surface 30 or between the adjacent blind hole 32 by photolithography process, and annealing the metal layer in the first annealing process to form a Schottky contact with high barrier height between epitaxy layers 3; forming another metal layer in the area near blind hole 32 or trench 31 in the first surface 30 by lithography process, and applying the second annealing process to the metal layer to form Schottky contact with low barrier height between epitaxy layers 3. Among them, the metal materials forming the above two barrier heights can be the same metal materials or different metal materials. The temperature of the first annealing process is higher than that of the second annealing process.

The semiconductor device manufacturing method according to an embodiment of the present invention also includes steps:

Forming the second metal layer 52 on the side wall and bottom of the trench 31 by photolithography process; forming the third metal layer 53 on the side wall and bottom of blind hole 32 by photolithography process; depositing the first electrode layer 1 on the surface of the substrate 2 deviating from the epitaxy layer 3; forming an ohmic contact on the second metal layer 52 and corresponding well region 4, the third metal layer 53 and corresponding well region 4, and the first electrode layer 1 and the substrate at the same time a by annealing process. Among them, the second metal layer 52 and the third metal layer 53 can be formed simultaneously for the same metal, which can simplify the process steps and save costs.

The semiconductor device manufacturing method according to an embodiment of the present invention also includes steps:

Depositing a thick metal layers are above the first metal layer 51, the second metal layer 52 and the third metal layer 53 to form electrical short joints. The first metal layer 51, the second metal layer 52, the third metal layer 53 and the thick metal layer altogether form the anode of the semiconductor device of the embodiment.

It should be noted that in this article, the sequence of process steps is only an example of the present embodiment. According to the cost control, the manufacturing process capability is different, and the sequence can be properly mobilized, without affecting the implementation effect of the embodiments of the present invention, which is also apparent to those skilled in the field.

Although the application has been described with reference to the preferred embodiments, various improvements can be made without departing from the scope of the application and components therein can be replaced with equivalents. In particular, as long as there is no structural conflict, the technical features mentioned in each embodiment can be combined in any way. The present application is not limited to the specific embodiments disclosed herein, but includes all technical solutions falling within the scope of the claims.

What is claimed is:

1. A semiconductor device, comprising:
    a first electrode layer;
    a substrate layer positioned on the first electrode layer, the substrate layer is a first conductive type and has a first doping concentration;
    an epitaxy layer positioned on the substrate layer and comprising a first surface far from the substrate layer, the epitaxy layer is the first conductive type and has a second doping concentration;
    a plurality of well regions of a second conductive type, the well regions are disposed by extending from the first surface into the epitaxy layer and orthographic projections thereof on the first surface are spaced from each other;
    a second electrode layer, comprising first metal layers, each disposed between adjacent two of the well regions on the first surface and forms a Schottky contact with the epitaxy layer, wherein the Schottky contact has variable barrier height.

2. The semiconductor device of claim 1, wherein the Schottky contact of the first metal layer has a lower barrier height at the areas close to the well region than other area.

3. The semiconductor device of claim 1, wherein the epitaxy layer are provided with trenches corresponding to at least some of the well regions, and each of the well regions is disposed by extending from side walls and bottom of the trench into the epitaxy layer.

4. The semiconductor device of claim 3, wherein the opening width of each of the trenches is larger than its bottom width.

5. The semiconductor device of claim 3, wherein the second electrode layer further comprises second metal layers, each of which is overlying the side walls and bottom of the trench.

6. The semiconductor device of claim 5, wherein the epitaxy layer is provided with blind holes corresponding to at least some of the well regions, and each of the well regions is disposed by extending from side walls and bottom of the blind hole into the epitaxy layer.

7. The semiconductor device of claim 6, wherein the second electrode layer further comprises third metal layers, each of which is overlying the side walls and bottom of the blind hole.

8. The semiconductor device of claim 6, wherein the depth of the trench is greater than or equal to the depth of the blind hole.

9. The semiconductor device of claim 6, wherein one or more blind holes are disposed between adjacent two of the trenches.

10. The semiconductor device of claim 6, wherein the opening width of the trench is larger than the opening width of the blind hole.

11. The semiconductor device of claim 7, wherein the second electrode layer further comprises an electrical connection layer, and the first metal layer, the second metal layer and the third metal layer are electrically connected via the electrical connection layer.

12. The semiconductor device of claim 7, wherein an ohmic contact is formed between the first electrode layer and the substrate layer, and is also formed between the second metal layer and the corresponding well region and between the third metal layer and the corresponding well region.

13. The semiconductor device of claim 1, wherein the first doping concentration is higher than the second doping concentration, and the first conductive type is opposite to the second conductive type, and the first conductive type is N-type.

14. A method for manufacturing semiconductor device, comprising:
   providing a first electrode layer;
   providing a substrate layer positioned on the first electrode layer, the substrate layer is a first conductive type and has a first doping concentration;
   providing an epitaxy layer positioned on the substrate layer and comprising a first surface far from the substrate layer, the epitaxy layer is the first conductive type and has a second doping concentration;
   providing a plurality of well regions of a second conductive type, the well regions are disposed by extending from the first surface into the epitaxy layer and orthographic projections thereof on the first surface are spaced from each other;
   providing a second electrode layer, comprising first metal layers, each disposed between adjacent two of the well regions on the first surface and forms a Schottky contact with the epitaxy layer, wherein the Schottky contact has variable barrier height.

15. The method for manufacturing semiconductor device of claim 14, wherein the first metal layer with different Schottky contact barrier heights is formed by alloying different metal materials with different Schottky contact barrier heights.

16. The method for manufacturing semiconductor device of claim 14, wherein the first metal layer with different Schottky contact barrier heights is formed by alloying metal materials through two times of metal-plating, wherein different annealing temperatures are applied after each metal-plating.

17. The method for manufacturing semiconductor device of claim 14, wherein the method for manufacturing semiconductor device further comprises: disposing a trench or blind hole on the first surface of the epitaxy layer, disposing the well region around the side walls and bottom of the trench or blind hole by ion implantation, the injection angle of the ion implantation at the side walls of the trench or blind hole is greater than or equal to 7 degrees.

* * * * *